Sept. 28, 1965 F. J. DONAHOE 3,208,878

THERMOELECTRIC DEVICES

Original Filed March 2, 1959

Inventor:
Francis J. Donahoe
by Howson & Howson
Attys.

United States Patent Office 3,208,878

Patented Sept. 28, 1965

3,208,878

THERMOELECTRIC DEVICES

Francis J. Donahoe, Philadelphia, Pa., assignor to The Franklin Institute of the State of Pennsylvania for the Promotion of the Mechanic Arts, Philadelphia, Pa., a corporation of Pennsylvania Continuation of application Ser. No. 796,668, Mar. 2, 1959. This application Dec. 26, 1962, Ser. No. 247,398

29 Claims. (Cl. 136—4)

Figure 2:
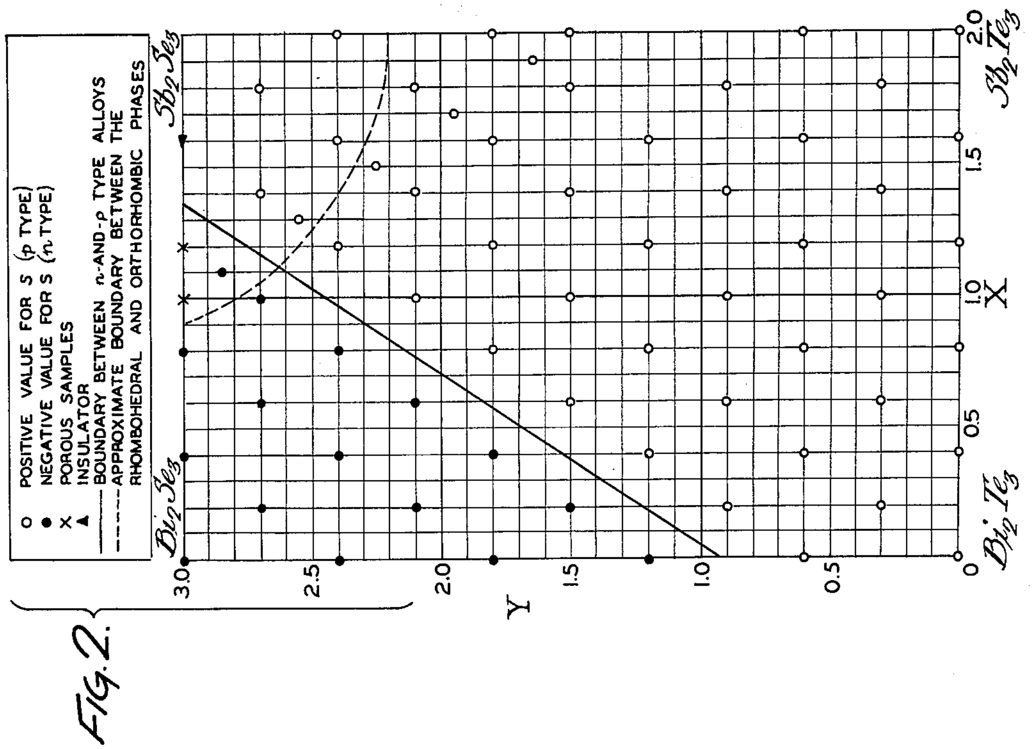

This application is a continuation of application Serial No. 796,668, filed March 2, 1959, and now abandoned.

This invention relates to thermoelectric technology, and more particularly provides novel compositions of matter having semiconducting properties and adapted for use in the preparation of thermoelectric devices and the like; thermoelectric devices embodying such compositions; and methods of preparing novel intrinsic semiconductors.

One of the advantageous discoveries embodied in the compositions of this invention comprises the provision of semiconductor materials characterized by unusually low lattice thermal conductivity.

It is known that if the junctions of a circuit comprising two dissimilar conductors are maintained at different temperatures, this causes an electromotive force to be produced in the circuit. This is known as the Seebeck effect. Conversely the application of an electromotive force to such a circuit causes the junctions of the conductors to assume a temperature differential. The ability of materials to produce this interconversion of heat and electricity in such a circuit is expressed by a value known as the Seebeck coefficient, which has a dimension of volt/° K.

The Seebeck coefficients of metals are so low as to offer little possibility of their utilization for thermoelectric purposes. However, it is possible to produce semiconductor materials having favorably high Seebeck coefficients by proper doping, that is, addition of small amounts of electrically active foreign substances to a semiconductor base material, to increase the number density of the charge carriers in the base. Using semiconductors having suitably high Seebeck coefficients, assemblies comprising a large number of alternating legs of dissimilar conductors can be used to exploit the Seebeck effect for practical purposes. On the one hand, electricity can be generated by maintaining a temperature differential between the sets of junctions of such an assembly. On the other hand, by applying an electromotive force to an assembly of this nature, there is produced a heat pump useful for heating or cooling an enclosed space.

When the geometry of such assemblies is optimized, it is found that efficiencies of both electric generators and heat pumps based thereon are dependent on a single parameter, called the figure of merit, Z. As Z is increased, increasingly higher efficiencies in the interconversion of heat and electricity are attained. Accordingly, it is highly desirable to provide materials such that the figure of merit Z can be made large.

The figure of merit Z for any given material is expressed by the equation $Z=S^2\sigma/K$, where S is the Seebeck coefficient, $\sigma$ is the electrical conductivity, and K is the thermal conductivity of the material. Of the three quantities which determine the value of Z, the limiting factor is a component of the thermal conductivity K. The major contribution to the thermal conductivity K are the free charge carrier thermal conductivity and the lattice thermal conductivity of the material. Thus the total thermal conductivity, to a first approximation, may be written as the sum of the lattice conductivity $K_g$ and the free charge conductivity $K_e$, or $$K=K_g+K_e$$

In a semiconductor containing a low density of free charge carriers, $K_e$ is usually much less than $K_g$.

By applying the band theory to semiconductors, it can be shown that $K_e/\sigma$ is independent of the density of free charge carriers and depends only on the absolute temperature. The Seebeck coefficient S increases in magnitude with decreasing free carrier concentration (provided the free carriers remain of one sign, that is, electrons or holes but not both together). The figure of merit $Z=S^2\sigma/(K_g+K_e)$ would accordingly increase indefinitely with decreasing carrier concentration if it were not for the effect of the lattice thermal conductivity $K_g$. It is the term $K_g$ in the equation for the value of Z which imposes a limit on the maximum value of Z for any given semiconductor. Other considerations being equal, the smaller $K_g$ is, the larger will the magnitude of Z be at the maximum.

It will accordingly be evident that in order to attain high efficiency in devices employing thermoelectric effects such as electric generators and heat pumps, the efficiency of which is a direct function of the figure of merit of the materials used in their construction, it is desirable to provide materials having minimal $K_g$ or lattice thermal conductivity values.

There are but few elements which have semiconductive properties, and their lattice thermal conductivities are unsatisfactorily high. In thermoelectric technology, attention has been directed to semi-conductive polycomponent alloys comprising binary or ternary salts. In such substances investigated hitherto, the primary focus of attention has been the effects of doping, that is, the addition of electrically active impurity elements to a semi-conductive base material. The electrically active impurity elements affect the number density of free charge carriers in the base. By appropriate doping, the electrical conductivity of a base can be increased substantially, and its figure of merit can be increased. However, if more than a relatively very low proportion of electrically active impurity atoms is introduced, the thermoelectric properties such as the Seebeck coefficient of the resulting semiconductor are affected adversely. Accordingly, it has not been possible hitherto to transcend the inherent limitations on attainable figures of merit which are imposed by the unfavorable lattice thermal conductivities of previously known semiconductors.

The novel semiconductive materials provided by this invention are characterized by unusually low lattice thermal conductivity, and thus constitute a more favorable base of starting material for the production of highly efficient thermoelectric devices than has been known prior to this invention.

A further and additional feature of the present invention comprises the provision of naturally occurring intrinsic semiconductors. As mentioned above, it has previously been known in semiconductor technology to use polycomponent compositions comprising binary or ternary salts as semiconductor base materials. To produce such compositions, the component elements or salts are melted together in the desired stoichiometric proportions corresponding to the desired composition of the base. As a usual rule, there is no exact correspondence between the highest melting composition which freezes out first from such a melt and the composition of the melt itself. Consequently, the product which solidifies will contain an excess of a cationic or an anionic element. For one thing, this predetermines the electrical properties of the semiconductive product: depending on the element present in excess, the semiconductor material will be either of the n- or the p-type. Furthermore, when there is this imbalance between the solid which freezes out from the melt and the melt composition, then as the highest melting composition solidifies out from the melt, it will be evident that the composition of the melt is altered thereby. This alters the nature of the composition which is the highest melting solid corresponding to the melt. The portion of the melt which initially solidifies, therefore, differs in composition from that which will solidify at a later time, and the ingot produced by solidification then has varying properties in the direction of solidification because of the changes in the ratio of the base elements caused by the stated effect. Accordingly, it is extremely difficult to maintain quality control in the production of semiconductor bases in which the lattice is composed of a plurality of elements. These difficulties could be avoided if there were available polycomponent compositions such that the highest melting polycrystalline alloy which freezes out from a stoichiometrically proportioned melt of the corresponding elements is itself so exactly stoichiometrically proportioned as to comprise an intrinsic semiconductor, substantially free of predetermined electrical imbalance. Particular advantages in the avoidance of the aforesaid difficulties would accrue insofar as there is a natural correspondence between the composition of the melt comprising the elements thereof in stoichiometric proportions and the highest melting composition which freezes out from such melt, which correspondence continues to exist as solidification of the melt proceeds.

It is an object of this invention to provide novel semiconductor compositions adapted for use in electrical devices.

A particular object of this invention is to provide novel quaternary compositions characterized by a low lattice thermal conductivity.

A further object of this invention is to provide novel semiconductor compositions having a naturally high figure of merit.

Another object is to provide novel semiconductor base materials which are adapted to be doped so as to produce thermoelectric semiconductor compositions having selected desired properties.

An additional object of this invention is to provide novel semiconductor compositions adapted for facilitating quality control in the production thereof; and a method of making the same.

Another object is to provide thermoelectric devices embodying novel thermoelectric semiconductor compositions.

These and other objects will be evident from the consideration of the following specification and claims.

It has now been discovered that the metals or cationic elements, bismuth and antimony, and the non-metals or anionic elements, tellurium and selenium, in the proportions of two atoms of cationic element to three of anionic element, form quaternary compounds which exhibit interesting and unusual properties, especially for thermoelectric applications. More particularly, it has been found that the novel quaternary compositions of this invention have exceptionally low lattice thermal conductivities. Particularly low lattice thermal conductivities are obtained within certain compositional ranges close to the transition region from naturally p-type to naturally n-type semiconductors, as further set forth hereinafter. Furthermore, the novel type of composition provided by this invention also includes certain compositions found to be characterized by a naturally high figure of merit. Additionally, it has been found that within a particular compositional range as set forth hereinafter, there occurs a transition between a stoichiometric composition of the melt which produces naturally n-type semiconductor products as the highest melting solid which freezes out therefrom, and compositions which produce p-type semiconductors; and this range comprises a transition region in which the highest melting solid which freezes out from the stoichiometrically proportioned melt is a polycrystalline intrinsic semiconductor having a composition which remains substantially uniformly stoichiometric as the solidification proceeds.

The exceptionally low lattice thermal conductivity of the compositions of the present invention provides semiconductor materials of a hitherto unparalleled suitability for the attainment of maximal figures of merit. With the inherently limiting factor of lattic thermal conductivity minimized, it becomes possible to advance in the direction of higher and more economically feasible efficiencies for thermoelectric devices of both the electric generator and heat pump types.

An additional benefit of this invention is the provision of polycomponent semiconductor materials which are naturally intrinsic semiconductors. These materials are so exactly stoichiometrically proportioned that they are substantially free of predetermined electrical bias, and accordingly constitute uniformly neutral polycomponent semiconductor bases which offer marked advantages in the simplification of quality control in semiconductor production.

Figure 3:
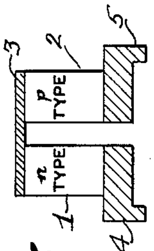
Figure 1:
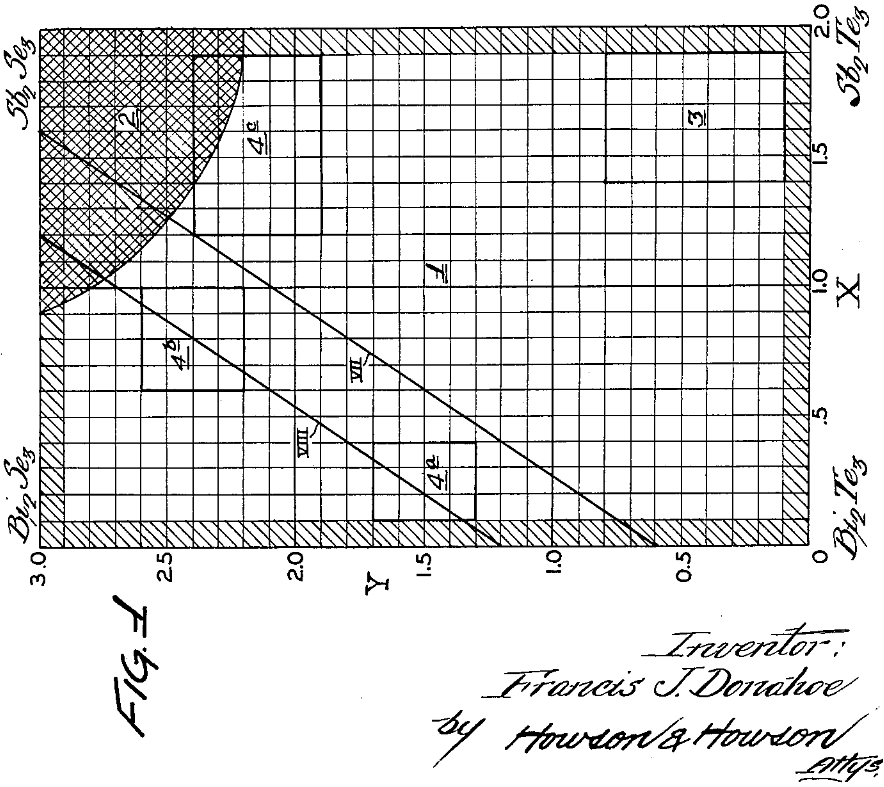

The invention will be better understood from a consideration of the drawings, in which:

FIGURE 1 presents a graphical representation of various compositions provided by this invention;

FIGURE 2 illustrates the sign of the conductivity of compositions embraced within the scope of the invention; and FIGURE 3 is a schematic diagram of a thermoelectric couple.

Broadly, the compositions of the invention are defined by the general formula (I) $Bi_{2-x}Sb_xTe_{3-y}Se_y$ where $0<x<2$ and $0<y<3$ As will be evident from this formula, the compositions of the invention contain atoms of each of four elements, to form a quaternary composition. It is to be understood that each of the stated elements Bi, Sb, Te and Se has a position in the lattice array; as distinguished from solutions of one or more elements in a salt or in another element or alloy, the numbers of the stated cationic and anionic elements present in the lattice will correspond, to produce a substantially electrically balanced product. The compositions defined by the stated Formula I are those embraced within the general range illustrated by Figure 1. The limiting binary and ternary compositions represented by the corners and boundary lines of this figure are of course excluded by virtue of the terms $0<x<2$ and $0<y<3$ of the formula.

The compositions of the foregoing formula are particularly contemplated in the embodiment of the formula (II)

$Bi_{2-x}Sb_xTe_{3-y}Se_y$ where $0.1 \leqslant x \leqslant 1.9$ and $0.1 \leqslant y \leqslant 2.9$ The symbol $\leqslant$ preceding a number or letter, as in accepted mathematical practice, in this and succeeding formulas means "is equal to or less than." The compositions corresponding to Formula II stated above are those indicated by the numeral 1 on FIGURE 1, comprised inside of and excluding the shaded border of this figure. They contain a substantial number of atoms of each of the four elements included in the compositions of this invention, of which each exerts a significant effect on the overall properties of the products. Each element has a position in the electrically balanced lattice of the quaternary composition and contributes to the lattice properties thereof. Such compositions are characterized by a generally low lattice thermal conductivity.

It is found that over a very extensive section of the broad range of compositions embraced within this invention, the solid product has a rhombohedral crystal structure. Diantimony triselenide, however, is orthorhombic, and the compositions of this invention which consist to a greatly predominant extent of antimony and selenium are orthorhombic. Furthermore, when selenium and antimony are major constituents, the products tend to exhibit unfavorable properties. Selenium is difficult to purify completely of dissolved gas and the like, and the quaternary products of this invention also tend to exhibit gassing and porosity when the composition $Sb_2Se_3$ is approached closely. Accordingly, the compositions particularly preferred in accordance with this invention are the quaternary compositions characterized by a rhombohedral structure. In reference to the graphical representation of the presently provided quaternary compounds in FIG. 1, the double hatched corner marked 2 in the diagram, which includes $Sb_2Se_3$ as a limiting composition, represents the quaternary compositions which have an orthorhombic structure. The rhombohedral compositions within the scope of the invention accordingly comprises the quaternary compositions within the portion of the diagram excluding the area marked 2, and preferably also excluding the shaded border area of the figure, the line of demarcation between the orthorhombic and rhombohedral structure being defined on this graph by the equations $$2.20 \leqslant y \leqslant 3$$

and $x = 34.91 - 24.41y + 4.35y^2$.

The lattice component of thermal conductivity of polycrystalline quaternary alloys conforming to the foregoing Formula II and having a rhombohedral structure is generally less than 0.9 watt/meter ° K.

Within the broad range of the novel compositions of the invention defined in the foregoing, it is found that within certain limits, these quaternary compositions have a naturally high figure of merit Z. As mentioned above, Z is a measure of the efficiency of operation of thermoelectric electric generators or heat pumps employing a given material. A reasonable value of Z for modern thermoelectric materials is of the order of $2 \times 10^{-3}/°$ K. Materials falling within the scope of the compositions of this invention which naturally possess such a figure of merit, may be described by the formula (III)

$Bi_{2-x}Sb_xTe_{3-y}Se_y$ where $1.4 \leqslant x \leqslant 1.9$ and $0.1 \leqslant y \leqslant 0.8$ This is the area set off in the drawing in the lower right hand corner and labelled 3.

A further particularly preferred embodiment of the present invention and one which is of exceptional interest comprises the provision of compositions having extraordinarily low lattice thermal conductivity. While as stated, the compositions of this invention are generally of unusually low lattice thermal conductivity, the magnitude of this value is especially low with the particular compositions set forth hereinafter.

One such region of extremely low lattice thermal conductivity is that of the formula (IV)

$Bi_{2-x}Sb_xTe_{3-y}Se_y$ where $0.1 \leqslant x \leqslant 0.4$ and $1.3 \leqslant y \leqslant 1.7$ This is represented in FIGURE 1 by the region designated **4*a***.

A second such region of extremely low lattice thermoconductivity occurs at (V)

$Bi_{2-x}Sb_xTe_{3-y}Se_y$ where $0.6 \leqslant x \leqslant 1.0$ and $2.2 \leqslant y \leqslant 2.6$ This is the area set off on FIGURE 1 which is marked **4*b***.

A third such region is defined by (VI)

$Bi_{2-x}Sb_xTe_{3-y}Se_y$ where $1.2 \leqslant x \leqslant 1.9$ and $1.9 \leqslant y \leqslant 2.4$ This is the area identified as **4*c* in FIGURE 1. That portion of area 4*c*** which is of rhombohedral structure is especially preferred.

In these three several designated regions, the lattice component of thermal conductivity is less than 0.6 watt/meter ° K.

The quaternary compositions characterized by especially low lattice thermal conductivity and defined by the foregoing formulas corresponding to sections **4*a*, *b*, and *c***, in FIGURE 1, fall close to and overlap into a compositional range which is of particular and unique properties. This is the transition region between naturally n-type and naturally p-type products, at which transition region the compositions of this invention comprise intrinsic semiconductors.

As mentioned hereinabove, the Seebeck coefficient tends to increase as the number density of free charge carriers decreases. The free charge carriers comprising electrons or holes in a semiconductor come from ionized impurity atoms. The impunrity atoms may be the same as or different from atoms present in the semiconductor base lattice, but in either case, they are of such a nature and amount as to produce an electrical imbalance in the lattice with consequent formation of free charge carriers. Additionally, however, a contribution to the conductivity of the carrier is made by the semiconductor base itself. Thermal excitation at any temperature above 0° K. will always produce a few electrons and an equal number of holes, though this number may be very small for any finite energy gap between the valence and the conduction band. Normally, the effect of these carriers is negligible in comparison with the effect of the vastly larger number of carriers of one sign derived from the impurity atoms. However, as the number of impurity atoms per unit volume is reduced, a point is reached at which it is no longer possible to neglect the effect of the charge carriers deriving from the semiconductor base lattice. Now, while impurity atoms contribute a large number of carriers which are all of one sign, the carriers deriving from the semiconductor base lattice comprise an equal number of electrons and of holes, that is an equal number of carriers of opposite signs. When charge carriers of both signs are present, an internal circulation takes place and in effect the Seebeck coefficient due to charge carriers of one sign is internally compensated by that of carriers of the opposite signs. If there is no difference between the mobilities of the electrons and holes, the Seebeck coefficient vanishes when the number of chareg carriers is equal. It vanishes at some different value if the mobilities are unequal. When the Seebeck coefficient falls off due to this internal compensation, the semiconductor becomes intrinsic. The production of a naturally intrinsic semiconductor has great practical significance.

One of the major difficulties in producing semiconducting compounds with reproducible characteristics is the fact that the compound which freezes first from the melt of stoichiometric composition is generally not of stoichiometric composition. The highest melting compound, which freezes out first, will contain a slight excess of at least one of the components of the melt, as compared to the melt composition.

The abstraction of a larger amount of one component than of another into the solids separating from the melt produces an imbalance in the composition of the melt. The ingot produced by solidification then has varying properties along its length caused by changes in the ratio of the base elements. This continuously changing composition causes the conductivity and other properties such as the Seebeck coefficient of the solid ingot to vary along the length thereof. Quality control in the production of polycomponent based semiconductors is accordingly complex and fraught with difficulties.

Now in the study of the compositions of this invention, it has been found that the plot of the sign of the Seebeck coefficient for quenched specimens of the quaternary composition has a remarkable appearance. All the alloys in one section of the phase diagram are p-type while those in the corner near bismuth selenide are n-type. It appears that the highest melting compound freezing out from a melt of stoichiometric composition is an alloy biased in favor of an excess of one type of component in the corner near bismuth selenide and biased in the opposite direction in the remainder of the diagram. The boundary is where the stoichiometric composition coincides with the solid of maximum melting point.

As the alloys of this invention approach stoichiometric composition, accordingly, they offer particular advantages. Because of the decrease in charge carrier concentration, the Seebeck coefficient is increased. At the exact transition region from the n-type to the p-type, compositions are obtained which are of uniformly stoichiometric composition and which comprise intrinsic semiconductors. This offers a particularly advantageous semiconducting base, of a complex composition favorable for thermoelectric applications, and yet unusually amenable to consistent quality control.

The stated range containing the transition region is defined by the following formulas:

(VII)

$Bi_{2-x}Sb_xTe_{3-y}Se_y$ where $0 \leqslant x \leqslant 1.6$ and $y=3/2x+0.6$ (VIII)

$Bi_{2-x}Sb_xTe_{3-y}Se_y$ where $0 \leqslant x \leqslant 1.2$ and $y=3/2x+1.2$

Generally, the particular benefits of this invention will be especially evident when compositions are employed which fall within the area designated 1 on FIG. 1 and which lie outside of the area designated 2. Thus, on the one hand, the compositions will contain at least a significant number of atoms of antimony as well as bismuth forming the cationic element component of the lattice, at least one such atom in twenty being antimony. On the other hand, the compositions will desirably be those of rhombohedral structure avoiding close approach to the orthorhombic compositions occurring near the limiting formula $Sb_2Se_3$.

To obtain the stated naturally intrinsic semiconductors, a melt will be prepared having a composition falling along the line of the transition region intermediate between the stated formulas defining limits of the transition range. The polycrystalline quaternary semiconductor obtained by freezing such a melt, slowly or rapidly, to produce solidification thereof will be uniformly stoichiometric as the deposition thereof from the melt proceeds. There will generally be a substantial equivalence between the composition of the solid and that of the melt; however, this will not necessarily be the case, for the proportion of one of the cationic elements, bismuth and antimony, to the other may vary to some extent as the solidification proceeds. Nevertheless, in any case the proportion of the total of the cationic elements to the total of the anionic elements remains constant at the stoichiometric ratio of 2:3, and the resulting quaternary composition is a naturally intrinsic semiconductor, presenting a uniformly stoichiometric composition.

The portions of the above-described transition range which intersect regions of naturally especially low lattice thermal conductivity form one especially desirable embodiment of the invention. Thus, for example, it will be seen from reference to FIG. 1 that the stated range is comprised within the lines designated VII and VIII respectively. This region intersects the sections marked 4*a* and 4*b*. Thus, one preferred composition will be represented by the portion of section 4*a* falling between lines VII and VIII, that is, will conform substantially to the formula $Bi_{2-x}Sb_xTe_{3-y}Se_y$ where $0.1 \leqslant x \leqslant 0.4$ and $1.3 \leqslant y \leqslant 1.7$ and fall within the transition range defined by the limiting formula $Bi_{2-x}Sb_xTe_{3-y}Se_y$ where $0 \leqslant x \leqslant 1.6$ and $y=3/2x+0.6$ and $Bi_{2-x}Sb_xTe_{3-y}Se_y$ where $0 \leqslant x \leqslant 1.2$ and $y=3/2x+1.2$ The second such composition, representing the intersection of section 4*b* with the transition range between VII and VIII will conform substantially to the formula $Bi_{2-x}Sb_xTe_{3-y}Se_y$ where $0.6 \leqslant x \leqslant 1.0$ and $2.2 \leqslant y \leqslant 2.6$ and fall within the range defined by the limiting formulas $Bi_{2-x}Sb_xTe_{3-y}Se_y$ where $0 \leqslant x \leqslant 1.6$ and $y=3/2x+0.6$ and $Bi_{2-x}Sb_xTe_{3-y}Se_y$ where $0 \leqslant x \leqslant 1.2$ and $y=3/2x+0.2$ A specific composition exemplifying the naturally intrinsic semiconductors of this invention is that of the formula $$Bi_{1.25}Sb_{0.75}Te_{1.125}Se_{1.875}$$

The stated composition is particularly useful for the preparation of semiconductor materials by doping.

It is, of course, to be understood that any of the presently provided compositions may and desirably will be doped or otherwise treated to modify their electrical and thermoelectrical properties in the course of preparation of finished semiconductor products therefrom. The methods by which the free charge carrier concentration in semiconducting materials may be varied are well known. Atoms of some foreign element, such as lead, iodine, or the like, are introduced in concentrations ranging from a trace up to 1 to 2 atomic percent. Alternatively, in the case of compound semiconductors, one of the several elements entering into the crystalline lattice may be present in excess or defect of the stoichiometric ratio in order to control the properties thereof. The departure from the atom ratio of metal to non-metal, that is, of the metals bismuth and antimony to the non-metals tellurium and selenium, amounting to 2:3 at the stoichiometric ratio, may range up to 2 atomic percent. Furthermore, sulfur may replace part of the tellurium or selenium up to the limits of solid solubility in the rhombohedral phase.

Thermoelectric devices embodying the invention will include at least one semiconductor leg comprising a composition as provided by this invention set forth hereinabove. The stated device will comprise one or more thermoelectric couples, taking the form illustrated schematically in FIGURE 3 wherein one leg of the couple comprising an n-type semiconductor leg 1 is conductively joined by a conductive member 3 of low resistance to a p-type semiconductor leg 2. Leg 1 is in turn connected, at a point removed from the connecting member 3, to a lead 4, composed of conductive material, and leg 2 is similarly connected to a lead 5, composed of conductive material. This invention provides both n-type and p-type semiconductor compositions, and if desired, these may be respectively employed to form the stated n-type and p-type semiconductor legs of the thermoelectric couples in the thermoelectric device. Alternatively, a selected composition of the invention may comprise one leg of the thermoelectric couple, conductively joined to a leg of opposite conductivity sign of any suitable nature, such as p-type bismuth telluride, n-type lead telluride, or the like. Generally, the conductive member 3, joining the semiconductor legs 1 and 2, and the leads 4 and 5 will be suitably composed of copper.

When the thermoelectric device is designed for use as a heat pump, a current I will be introduced into the thermoelectric circuit producing a temperature differential between the connecting member 3 and the leads 4 and 5, which will in turn produce the desired change in temperature of the space to which the leads or the connecting member are exposed. Where it is designed for use as a power generator, the connecting member 3 will be maintained at a temperature different from that of the leads 4 and 5, producing a current in the circuit which will be taken off from the leads and fed to an external circuit where it does useful work. The considerations entering into the design of thermoelectric devices, particularly as to design of thermoelectric devices, particularly as to design of the geometry of the devices of maximize efficiency, are well known, and can readily be applied to the technical utilization of the presently provided compositions by those skilled in the art.

The invention is illustrated but not limited by the following examples:

*Example I*

This example illustrates the prepartion of the composition of the invention. It is essential that all of the materials employed be of high purity: 99.9%+. If elements of the desired purity are not commercially available, they may be purified by zone refining or other methods known to the art.

Stoichiometric amounts of the four elements corresponding to the selected product composition are sealed in a quartz tube. The tube is placed in a vertical furnace and the furnace temperature raised to 100° C. above the melting point of the quaternary compound. While at this temperature and with its contents molten, the tube is shaken vigorously to ensure thorough mixing. The liquid compositions are then solidified very rapidly by plunging the sealed tube, with its contents, into cold water. The object of this rapid freezing is to insure uniform small grain size and avoid gross segregation of the components. The actual structure is found to consist of equiaxed crystallites on the surface with columnar grains extending to the center of the cast rods.

Using the above-described procedure, compositions were prepared cover the field of variations on the general formula $Bi_{2-x}Sb_xTe_{3-y}Se_y$ where $x$ ranges from 0 to 2 and $y$ ranges from 0 to 3.

Data obtained in this study are represented schematically in FIG. 2 of the drawings, showing the abrupt change in sign of the Seebeck coefficient as the transition region is crossed.

*Example II*

The following data illustrate the physical properties of compositions comprised within the scope of the invention:

| Compound | $S\times10^6$, V/° K. | $\sigma\times10^2$, $ohm^{-1}=m.^{-1}$ | $K^e$, watts/m.° K. | $K^g$, watts/m. ° K. |
|---|---|---|---|---|
| $Bi_{1.0}Sb_{1.0}Te_{1.5}Se_{1.5}$ (central position) | +246 | 33 | 0.02 | 0.60 |
| $Bi_{0.4}Sb_{1.6}Te_{2.4}Se_{0.6}$ (region 3) | +130 | 506 | 0.25 | 0.71 |
| $Bi_{1.8}Sb_{0.2}Te_{1.5}Se_{1.5}$ (region 4a) | −200 | 111 | 0.06 | 0.53 |
| $Bi_{1.2}Sb_{0.8}Te_{0.6}Se_{2.4}$ (region 4b) | −153 | 82 | 0.04 | 0.53 |
| $Bi_{0.6}Sb_{1.4}Te_{0.9}Se_{2.1}$ (region 4c) | +132 | 143 | 0.07 | 0.54 |
| $Bi_{1.2}Sb_{0.8}Te_{1.2}Se_{1.8}$ (between VII and VIII) | +269 | 19 | 0.01 | 0.61 |
| $Bi_{1.125}Sb_{0.875}Te_{1.125}Se_{1.875}$ (intrinsic semiconductor) | 14.6 | 15 | ---- | 0.64 |

While the invention has been illustrated with reference to various particular preferred embodiments thereof, it is to be appreciated that variations and modifications may be made within the scope of the invention and the appended claims.

What is claimed is:

1. A quaternary, semiconductive composition, the lattice array of which comprises the cationic elements bismuth an antimony and the anionic elements tellurium and selenium, in substantially stoichiometric proportions of two atoms of cationic element and three atoms of anionic element and having the formula $$Bi_{2-x}Sb_xTe_{3-y}Se_y$$

where $0<x<1.6$ and $\frac{3}{2}x+0.6\leqslant y<3$.

2. A composition as defined in claim 1 of rhombohedral structure.

3. An n-type quaternary, semiconductive composition, the lattice array of which comprises the cationic elements bismuth and antimony and the anionic elements tellurium and selenium, in substantially stoichiometric proportions of two atoms of cationic element to three atoms of anionic element and having the formula $$Bi_{2-x}Sb_xTe_{3-y}Se_y$$

where $0<x<1.2$ and $\frac{3}{2}x+1.2\leqslant y<3$.

4. A composition as defined in claim 3, of rhombohedral structure.

5. A quaternary, semiconductive composition, characterized by a lattice thermal conductivity of less than 0.6 watt/meter ° K., of the formula $$Bi_{2-x}Sb_xTe_{3-y}Se_y$$

where $0.1\leqslant x\leqslant0.4$ and $1.3\leqslant y\leqslant1.7$.

6. A quaternary, semiconductive composition, characterized by a lattice thermal conductivity of less than 0.6 watt/meter ° K., of the formula $Bi_{2-x}Sb_xTe_{3-y}Se_{-y}$ where $0.6\leqq x\leqq1.0$ and $2.2\leqq y\leqq2.6$.

7. A quaternary, semi-conductive composition, characterized by a lattice thermal conductivity of less than 0.6 watt/meter ° K., of the formula $Bi_{2-x}Sb_xTe_{3-y}Se_y$ where $1.2\leqq x\leqq1.9$ and $1.9\leqq y\leqq2.4$.

8. A quaternary, semiconductive composition within the transition range from naturally p-type to naturally n-type compositions comprising the cationic elements bismuth and antimony and the anionic elements tellurium and selenium in substantially stoichiometric proportions of two atoms of cationic element to three atoms of anionic element, said transition range being defined by the limiting formulas $Bi_{2-x}Sb_xTe_{3-y}Se_y$ where $0\leqq x\leqq1.6$ and $y=\frac{3}{2}x+0.6$, and $Bi_{2-x}Sb_xTe_{3-y}Se_y$ where $0\leqq x\leqq1.2$ and $y=\frac{3}{2}x+1.2$.

9. A composition as defined in claim 8 of rhombohedral structure, and at least one cationic element in twenty in said composition comprising antimony.

10. A semiconductor composition within the transition range from naturally n-type to naturally p-type semiconductive composition of the general formula $$Bi_{2-x}Sb_xTe_{3-y}Se_y$$

where $0<x<2$ and $0<y<3$, and characterized by a lattice thermal conductivity of less than 0.6 watt/meter ° K., said composition conforming substantially to the formula $Bi_{2-x}Sb_xTe_{3-y}Se_y$ where $0.1\leqq x\leqq0.4$ and $1.3\leqq y\leqq1.7$ and falling within the transition range defined by the limiting formulas $Bi_{2-x}Sb_xTe_{3-y}Se_y$ where $0\leqq x\leqq1.6$ and $y=\frac{3}{2}x+0.6$ and $Bi_{2-x}Sb_xTe_{3-y}Se_y$ where $0\leqq x\leqq1.2$ and $y=\frac{3}{2}x+1.2$.

11. A semiconductor composition within the transition range from naturally n-type to naturally p-type semiconductive composition of the general formula $$Bi_{2-x}Sb_xTe_{3-y}Se_y$$

where $0<x<2$ and $0<y<3$, and characterized by a lattice thermal conductivity of less than 0.6 watt/meter ° K., said composition conforming substantially to the formula $Bi_{2-x}Sb_xTe_{3-y}Se_y$ where $0.6\leqq x\leqq1.0$ and $2.2\leqq y\leqq2.6$ and falling within the transition range defined by the limiting formulas $Bi_{2-x}Sb_xTe_{3-y}Se_y$ where $0\leqq x\leqq1.6$ and $$y=\frac{3}{2}x+0.6$$

and $Bi_{2-x}Sb_xTe_{3-y}Se_y$ where $0\leqq x\leqq1.2$ and $y=\frac{3}{2}x+1.2$.

12. A semiconductor composition of the formula $$Bi_{1.8}Sb_{0.2}Te_{1.5}Se_{1.5}$$

13. A semiconductor composition of the formula $$Bi_{1.2}Sb_{0.8}Te_{0.6}Se_{2.4}$$

14 A semiconductor composition of the formula $$Bi_{0.6}Sb_{1.4}Te_{0.9}Se_{2.1}$$

15. Asemiconductor composition of the formula $$Bi_{1.2}Sb_{0.8}Te_{1.2}Se_{1.8}$$

16. A semiconductor composition of the formula $$Bi_{1.25}S^{b}{}_{0.875}Te_{1.125}Se_{1.875}$$

17. A thermoelectric semiconductor comprising up to about 2 atomic percent of electrically active impurity atoms distributed in the lattice array of a composition as set forth in claim 1.

18. A thermoelectric semiconductor comprising up to about 2 atomic percent of electrically active impurity atoms distributed in the lattice array of a composition as set forth in claim 9.

19. A thermoelectric semiconductor comprising up to about 2 atomic percent of electrically active impurity atoms distributed in the lattice array of a composition as set forth in claim 9.

20. A thermoelectric semiconductor comprising up to about 2 atomic percent of electrically active impurity atoms distributed in the lattice array of a composition as set forth in claim 16.

21. A thermoelectric device including at least one semiconductor leg comprising up to about 2 atomic percent of electrically active impurity atoms distributed in a lattice array having the composition defined in claim 1.

22. A thermoelectric device including at least one semiconductor leg comprising up to about 2 atomic percent of electrically active impurity atoms distributed in a lattice array having the composition defined in claim 3.

23. A thermoelectric device including at least one semiconductor leg comprising up to about 2 atomic percent of electrically active impurity atoms distributed in a lattice array having the composition defined in claim 9.

24. A thermoelectric device including at least one semiconductor leg comprising up to about 2 atomic percent of electrically active impurity atoms distributed in a lattice array having the composition defined in claim 16.

25. The method of preparing a semiconductor which comprises preparing a melt consisting of bismuth, antimony, tellurium and selenium, in stoichiometric proportions of two atoms of said cationic elements to three atoms of said anionic elements, at a transition point intermediate between compositions producing p-type semiconductors, defined by the formula $Bi_{2-x}Sb_xTe_{3-y}Se_y$ where $0 \leq x \leqq 1.6$ and $y=3/2x+0.6$ and compositions producing n-type semiconductors, defined by the formula $Bi_{2-x}Sb_xTe_{3-y}Se_y$ where $0 \leq x \leq 1.2$ *and* $y+3/2x+1.2$ and freezing out from said melt polycrystalline semiconductor having a composition which remains substantially uniform by stoichiometric as the solidification continues.

26. The method of claim 25, wherein at least one cationic element in twenty in said melt comprise antimony, and said polycrystalline semiconductor has a rhombohedral structure.

27. The method of claim 25 wherein said melt is of a composition corresponding to a transition point intermediate between the compositions defined by said formulas, and conforming to the formula $Bi_{2-x}Sb_xTe_{3-y}Se_y$ where $0.1 \leqq x \leq 0.4$ and $1.3 \leq y \leq 1.7$.

28. The method of claim 25 wherein said melt is of a composition corresponding to a transition point intermediate between the compositions defined by said formulas and conforming to the formula $Bi_{2-x}Sb_xTe_{3-y}Se_y$ where $0.6 \leq x \leq 1.0$ and $2.2 \leq y \leq 2.6$.

29. The method of claim 25, wherein said melt is of a composition defined by the formula $$Bi_{1.25}Sb_{0.75}Te_{1.125}Se_{1.875}$$

References Cited by the Examiner

UNITED STATES PATENTS

| | | | |
|---|---|---|---|
| 2,762,857 | 9/56 | Lindenblad | 136—5 |
| 2,957,937 | 10/60 | Jensen et al. | 136—5 |
| 2,990,439 | 6/61 | Goldsmid et al. | 136—5 |
| 3,017,446 | 1/62 | Goldsmith et al. | 136—5 |

WINSTON A. DOUGLAS, *Primary Examiner.*

JOHN H. MACK, *Examiner.*

UNITED STATES PATENT OFFICE
CERTIFICATE OF CORRECTION

Patent No. 3,208,878 September 28, 1965

Francis J. Donahoe

It is hereby certified that error appears in the above numbered patent requiring correction and that the said Letters Patent should read as corrected below.

Column 4, line 5, for "lattic" read -- lattice --; column 5, line 11, for "comprises" read -- comprise --; column 6, line 39, for "chareg" read -- charge --; column 8, line 5, for "0.2" read -- 1.2 --; line 23, for "1 to 2" read -- 1 or 2 --; lines 70 and 71, strike out "particularly as to design of thermoelectric devices,"; line 72, for "of maximize" read -- to maximize --; column 9, in the table, heading to the third column, for $\sigma\times10^{2}$, ohm$^{-1}$=m.$^{-1}$ read $\sigma\times10^{-2}$, ohm$^{-1}$ m.$^{-1}$ column 10, line 12, for "$Bi_{2-x}Sb_xTe_{3-y}Se_{-y}$" read -- $Bi_{2-x}Sb_xTe_{3-y}Se_y$ --.

Signed and sealed this 27th day of December 1966.

(SEAL)
Attest:

ERNEST W. SWIDER
Attesting Officer

EDWARD J. BRENNER
Commissioner of Patents

UNITED STATES PATENT OFFICE

CERTIFICATE OF CORRECTION

Patent No. 3,208,878 September 28, 1965

Francis J. Donahoe

It is hereby certified that error appears in the above numbered patent requiring correction and that the said Letters Patent should read as corrected below.

Column 4, line 5, for "lattic" read -- lattice --; column 5, line 11, for "comprises" read -- comprise --; column 6, line 39, for "chareg" read -- charge --; column 8, line 5, for "0.2" read -- 1.2 --; line 23, for "1 to 2" read -- 1 or 2 --; lines 70 and 71, strike out "particularly as to design of thermoelectric devices,"; line 72, for "of maximize" read -- to maximize --; column 9, in the table, heading to the third column, for $\sigma \times 10^2$, ohm$^{-1}$=m.$^{-1}$ read $\sigma \times 10^{-2}$, ohm$^{-1}$ m.$^{-1}$ column 10, line 12, for "$Bi_{2-x}Sb_xTe_{3-y}Se_{-y}$" read -- $Bi_{2-x}Sb_xTe_{3-y}Se_y$ --.

Signed and sealed this 27th day of December 1966.

(SEAL)
Attest:

ERNEST W. SWIDER
Attesting Officer

EDWARD J. BRENNER
Commissioner of Patents